United States Patent
Grand et al.

(10) Patent No.: US 7,609,095 B2
(45) Date of Patent: Oct. 27, 2009

(54) SYSTEM AND METHOD FOR MAINTAINING DEVICE OPERATION DURING CLOCK SIGNAL ADJUSTMENTS

(75) Inventors: Gerald I. Grand, Cumming, GA (US); Mark Chambers, Mission Viejo, CA (US); Baobinh Truong, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 149 days.

(21) Appl. No.: 11/122,002

(22) Filed: May 5, 2005

(65) Prior Publication Data

US 2005/0259505 A1   Nov. 24, 2005

Related U.S. Application Data

(60) Provisional application No. 60/571,891, filed on May 18, 2004.

(51) Int. Cl.
*H03K 17/00* (2006.01)
(52) U.S. Cl. .......................................... 327/99; 327/291
(58) Field of Classification Search .................. None
See application file for complete search history.

(56) References Cited

U.S. PATENT DOCUMENTS

| | | | | |
|---|---|---|---|---|
| 5,155,380 A | * | 10/1992 | Hwang et al. | 327/99 |
| 5,373,254 A | * | 12/1994 | Nakauchi et al. | 331/1 A |
| 5,610,558 A | * | 3/1997 | Mittel et al. | 331/2 |
| 5,844,438 A | * | 12/1998 | Lee | 327/291 |
| 5,926,044 A | * | 7/1999 | Niimura | 327/99 |
| 6,577,169 B1 | * | 6/2003 | Cheng | 327/99 |
| 6,577,201 B2 | * | 6/2003 | Ho et al. | 331/16 |
| 6,600,345 B1 | * | 7/2003 | Boutaud | 327/99 |
| 6,639,449 B1 | * | 10/2003 | De La Cruz et al. | 327/407 |

* cited by examiner

*Primary Examiner*—Cassandra Cox
(74) *Attorney, Agent, or Firm*—Sterne, Kessler, Goldstein & Fox PLLC

(57) ABSTRACT

A system and method for seamlessly reprogramming clock frequencies includes a phase locked loop (PLL) that generates CPU and double data rate (DDR) clocks. A crystal is used to generate a reference clock. The CPU clock and the reference clock are inputs to a first multiplexer, and the DDR clock and reference clock are inputs to a second multiplexer. In normal operation the multiplexers provide the CPU and DDR clock signal as outputs. To reprogram the clock frequencies and reset the PLL, (1) the reference clock signal is selected to be the output of both multiplexers, so the device is running on the internal reference clock. The mux switching is synchronized with the CPU and DDR clock signals. (2) The PLL is reprogrammed, its internal voltage-controlled oscillator is reset, and the PLL is restarted at the new desired frequency. (3) When the new PLL frequency output is stable, the multiplexers are switched back to the PLL-generated CPU and DDR clocks, synchronously with the reference clock signal.

11 Claims, 5 Drawing Sheets

SYSTEM AND METHOD FOR MAINTAINING DEVICE OPERATION DURING CLOCK SIGNAL ADJUSTMENTS

CROSS-REFERENCE TO RELATED APPLICATION

This application claims the benefit of U.S. Provisional Application No. 60/571,891 filed May 18, 2004, which is incorporated herein by reference.

FIELD OF THE INVENTION

The present invention relates generally to apparatus and methods for adjusting clock rates and timing in a digital device without interrupting device operation.

BACKGROUND ART

Microprocessor-based systems and a variety of other digital circuits operate based on a clock signal. At times it is necessary to reset the clock signal generating circuit, change the frequency of the clock signal, or otherwise adjust the clock. When changing the frequency of a clock, a glitch is typically generated in the clock signal output. A glitch is a temporary malfunction in the clock; it occurs when two or more transitions (rising or falling edges) through the voltage threshold occur between sample periods. In a digitally operated circuit, a glitch will disrupt the execution of one of more machine instructions during the process of changing the clock frequency.

As an example, this phenomenon can be observed in the operation of satellite set-top boxes. In these devices, it is sometimes necessary or desirable to change the operating frequencies of the central processing unit (CPU) and double data rate (DDR) clocks. The introduction of these frequency changes would typically cause a glitch in the clock signal and may well crash the system. It is therefore necessary to interrupt operation of the set top box during frequency changes, or else reset the set-top box to overcome the disruption caused by the clock signal glitch.

Therefore, there is a general need for an improved system and method for adjusting the operation of a clock signal generating circuit used in digital systems of various types. There is also a particular need for improved clock adjustment apparatus and methods in the field of satellite set-top boxes.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
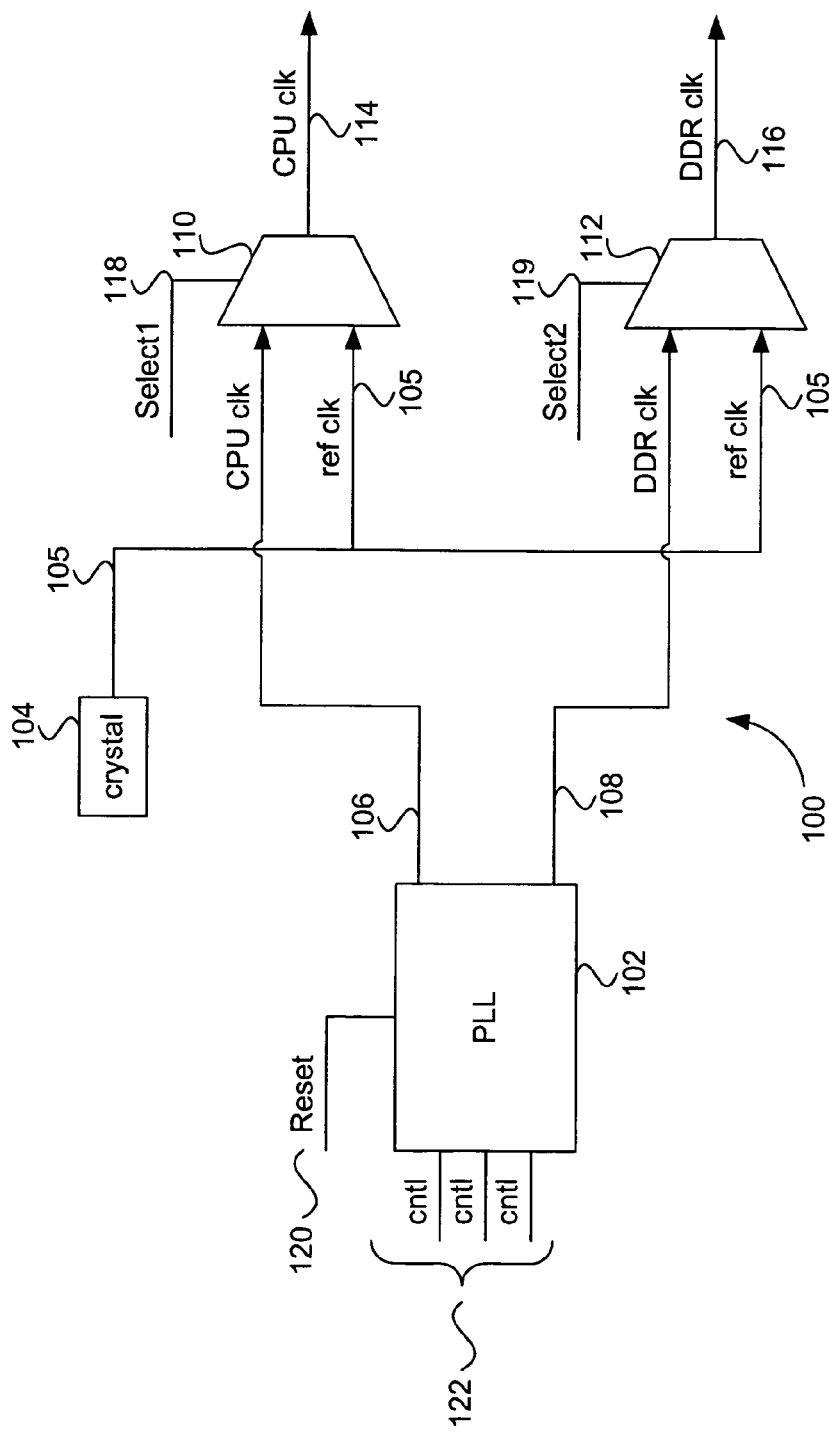
FIG. 1 is block schematic diagram of a circuit used in an exemplary embodiment of the invention.

The present invention will now be described with reference to the accompanying drawings. In the drawings, some like reference numbers indicate identical or functionally similar elements. Additionally, the left-most digit(s) of most reference numbers identify the drawing in which the reference numbers first appear.

DETAILED DESCRIPTION OF THE PREFERRED EMBODIMENTS

Embodiments of the present invention provide, among other things, improved apparatus and methods for adjusting clock signal generating circuits while keeping the device in continuous operation. Exemplary embodiments will now be described in detail with reference to the drawings.

FIG. 1 is a schematic diagram of an exemplary apparatus useful in one embodiment of the invention. Referring now to FIG. 1, clock circuit 100 includes a crystal 104 running at a reference frequency that generates reference clock signal 105. A phase-locked loop (PLL) 102 generates central processing unit (CPU) clock signal 106 and double data rate (DDR) clock signal 108. PLL 102 is preferably a programmable device with a reset control input 120 and other control inputs 122 to allow varying its operation in response to a control program in an external device (not shown). Crystal 104 may be a part of the PLL circuit and may thus provide a basic clock signal for the PLL circuit.

Multiplexer 110 has two inputs, CPU clock signal 106 and reference clock signal 105. Multiplexer 110 has a CPU clock signal output 114. A control signal is provided at output selection control 118 of multiplexer 110 to select either the CPU clock signal 106 or the reference clock signal 105 for transmission at CPU clock signal output 114.

Multiplexer 112 has two inputs, DDR clock signal 108 and reference clock signal 105. Multiplexer 112 has a DDR clock signal output 116. A control signal is provided at output selection control 119 of multiplexer 112 to select either the DDR clock signal 108 or the reference clock signal 105 for transmission at DDR clock signal output 116.

Preferably, multiplexers 110 and 112 are operated so that they change their outputs synchronously with their current clock signal output, in response to a signal at output selection control 118 or 119 indicating that the clock output should be switched. In this way, multiplexers 110 and 112 operate to eliminate glitches in their respective output clock signals. Glitchless operation is preferably attained by timing the switchover based on the state of the current clock output signals 114 and 116 in a manner that will be described in more detail below.

During system operation, it may be desirable to reprogram the frequencies of the clocks. For example, in the exemplary satellite set-top box described herein, PLL 102 may be reset during operation of the set-top box and the CPU and DDR clocks may be reprogrammed. An exemplary process for performing these functions is described below with reference to FIG. 2 and FIG. 3.

Figure 2:
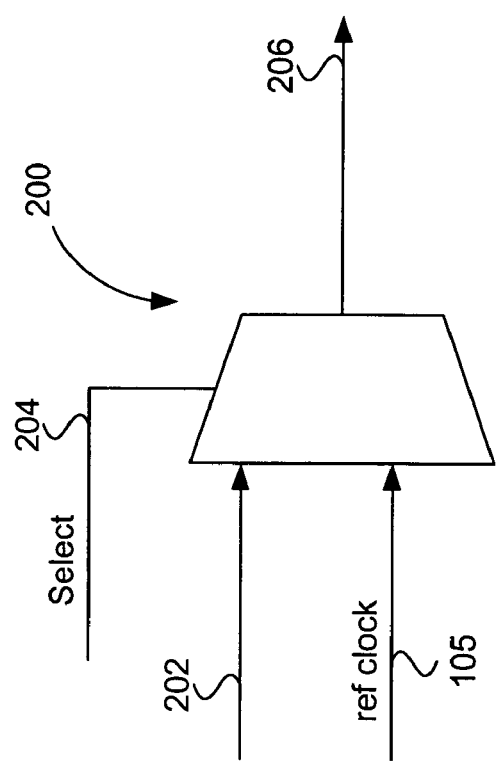
FIG. 2 is a block schematic diagram of a synchronous multiplexer circuit used in an embodiment of the invention.

First, the operation of multiplexers 110 and 112 will be described in more detail with reference to FIG. 2. FIG. 2 shows a multiplexer 200 which may be used in the circuit of FIG. 1 as either multiplexer 110 or multiplexer 112. Multiplexer 200 has two inputs, a generalized reference clock input 105 and a generalized digital clock signal 202. For example, digital clock signal 202 may represent CPU clock signal 106 or DDR clock signal 108 (both shown in FIG. 1). Multiplexer 200 has an output selection control input 204 that provides a signal to multiplexer 200 indicating which of the input signals 105 and 202 should be transmitted to output 206. The control signal at input 204 is preferably generated by a central processor (not shown) that controls operation of the set-top box or other device. Preferably instructions to change clock outputs are generated and transmitted to input 204 without regard to the timing of the generated clock signals. In this embodiment, it is not necessary for the change in the control signal to occur at a rising or falling edge of either of the input clocks. In this way, a seamless (glitch-free) transfer from one clock signal to the other is performed internal to multiplexer 200. It is also possible, although less preferred, to generate the control signal to input 204 with precise timing relative to the clock signal currently available at output 206, so as to reduce the incidence of glitches in the output. In this embodiment, synchronization is performed in any desired device external to multiplexer 200.

Figure 3:
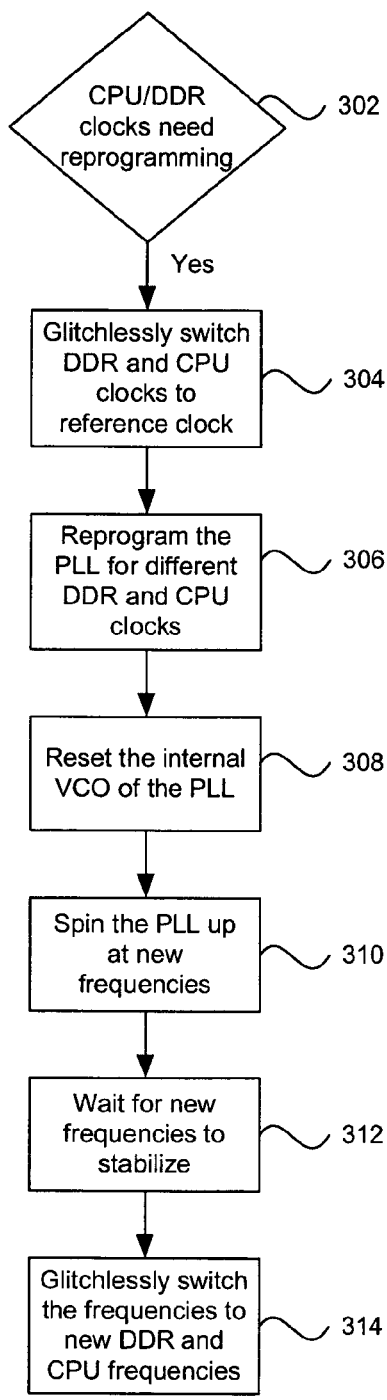
FIG. 3 is a flow chart showing an embodiment of a method for adjusting clock operation according to the present invention.

FIG. 3 shows an exemplary process for changing clock frequencies according to the present invention. Initially, the outputs of multiplexers 110 and 112 (shown in FIG. 1) are the CPU and DDR clock signals 114 and 116 respectively. In step 302, the process determines whether the clocks require reprogramming. If so, control passes to step 304. In step 304, the select lines (shown in FIG. 1 at 118 and 119) of the multiplexers (shown in FIG. 1 at 110 and 112) are set to select the reference clock and a seamless transition to the reference clock is implemented. Next, in step 306, the clock generating circuit operation is modified in any desired manner. For example, in step 308 the internal voltage controlled oscillator of a PLL device may be reset. Then, the clock generating circuit is restarted in step 310. In the case of a PLL, the device is started at the new frequency or frequencies. In step 312, the process waits until the output becomes stable, and in step 314 the multiplexers are glitchlessly switched back to use the CPU and DDR clock signals as outputs rather than the reference signal.

The operation of the examples has been described in terms of a satellite set-top box with a single clock frequency for DDR and CPU clocks. However, those skilled in the art will appreciate that the satellite set-top box is merely a single example of a system that can benefit from the features and advantages of the invention, and that the invention is not limited to this application. Further, the invention is not limited to operation with a single frequency. Any number of different frequencies may be generated by clock generating circuits within the device, and those frequencies can be transmitted through individual multiplexers and selectively switched to either a single reference frequency for temporary operation, or to a plurality of generated reference frequencies, as desired.

In general, in the preferred embodiment, when a changeover is indicated by the control input to the multiplexer, the multiplexer's internal control circuit will begin monitoring the output clock signal of the multiplexer (identical to the currently selected input signal). When that signal goes low, the multiplexer will hold its output low and monitor the input signal that is to become the new output signal. When the newly selected input signal goes low, the multiplexer switches so that the newly selected input signal becomes the output signal.

Figure 5:
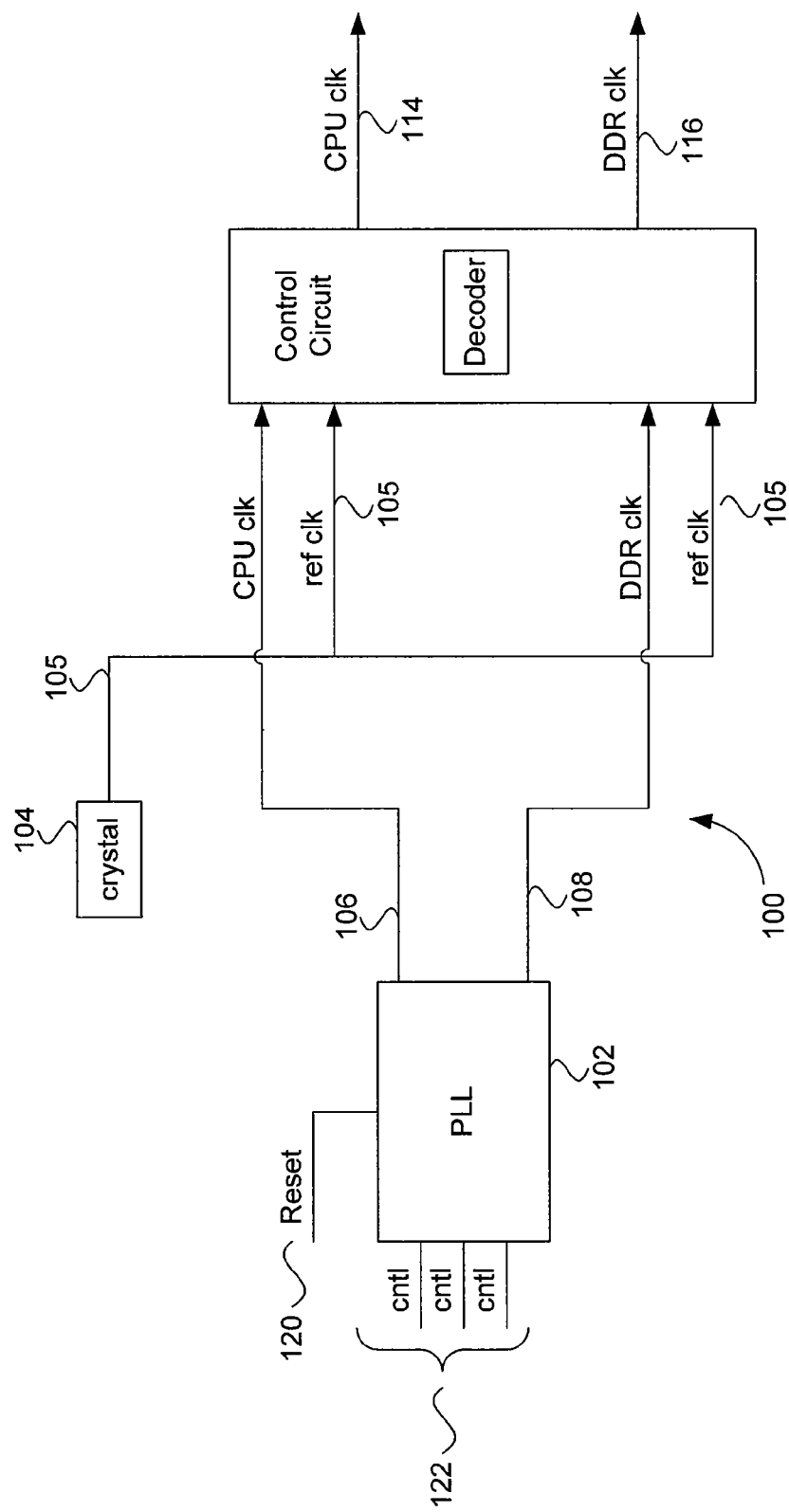
FIG. 5 illustrates a schematic diagram of a circuit including a decoder according to an embodiment of the invention.

In general, in the preferred embodiment, when a changeover is indicated by the control input to the multiplexer, the multiplexer's internal control circuit will begin monitoring the output clock signal of the multiplexer (identical to the currently selected input signal). When that signal goes low, the multiplexer will hold its output low and monitor the input signal that is to become the new output signal. When the newly selected input signal goes low, the multiplexer switches so that the newly selected input signal becomes the output signal. In an embodiment, a decoder may be used. FIG. 5 illustrates a schematic diagram of a circuit including a decoder according to an embodiment of the invention.

The result of this operation is that there may be a brief period, typically less than a few clock cycles, where the clock output signal is held low and no clock pulse is generated. This pause in the clock signals to the system typically will not affect operation in any noticeable way. This method of operation prevents an unsynchronized cycle of rising and falling clock pulses that might otherwise occur during a changeover between two clock signals.

Figure 4:
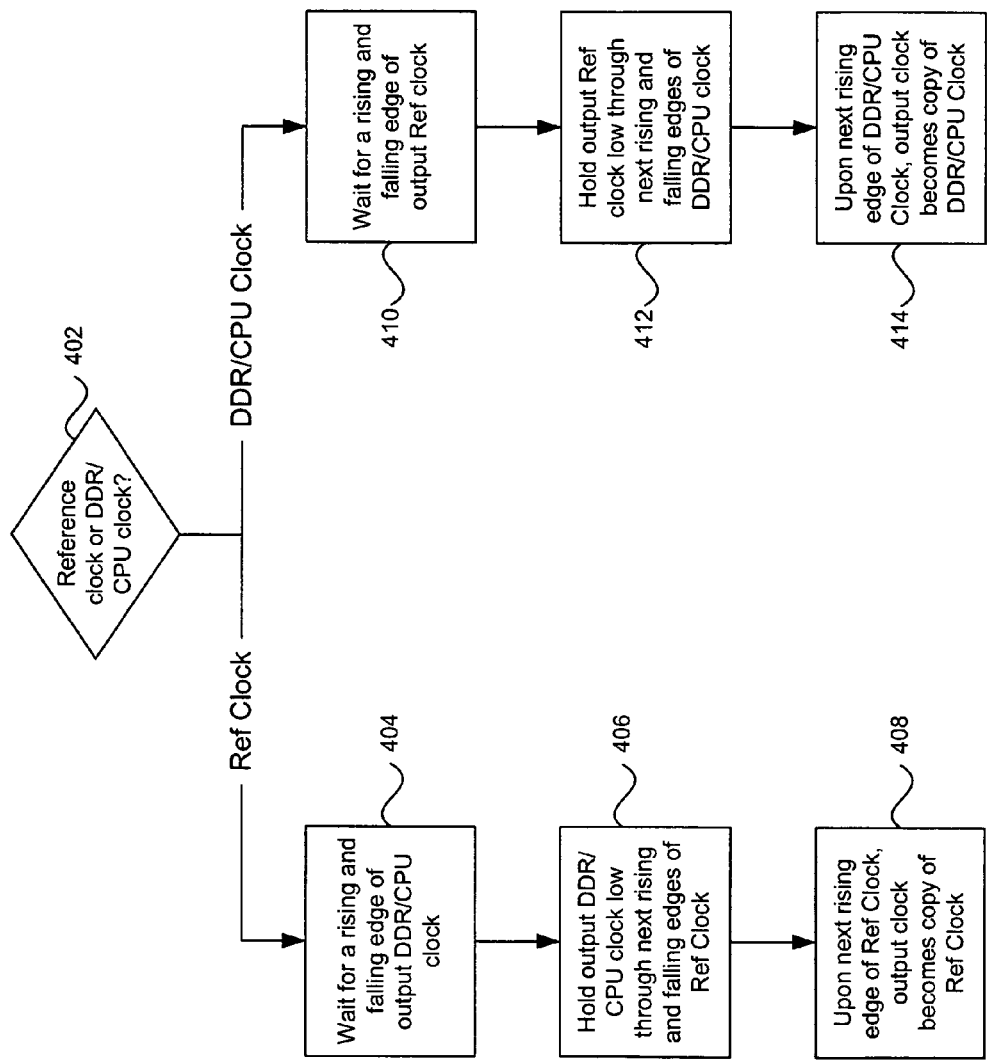
FIG. 4 is a flow chart showing operation of the multiplexer of FIG. 2 in one embodiment of the invention.

FIG. 4 shows an exemplary process for operating a multiplexer to change the output clock signal between the two available inputs in the context of the satellite set-top box example described above. In this example, the inputs are the standard clock signal and the reference clock signal.

In step 402, the device determines whether the clock output is to be switched to the reference clock, or to the DDR/CPU clock. If reference clock operation is desired, control passes to step 404. If the current operation is reference clock operation, and a changeover to DDR/CPU operation is desired, control passes to step 410.

In step 404, the process monitors the current output (DDR/CPU) until a rising and subsequent falling edge are detected. Then, in step 406, the output is held low through the next rising and falling edges of the reference clock. The output is no longer tracking the CPU or DDR clock, but is held low through the next rising and falling edge transitions of the reference clock, waiting to synchronize with the reference clock. In step 408, the output is switched to the reference clock so that upon the next rising edge of the reference clock, the output becomes a copy of the reference clock.

Because the output reference clock is held low during the transition from the frequency of the CPU or DDR clock to the reference clock, no glitches are seen and the frequency change occurs seamlessly.

Similarly, the disclosed method allows changing the output from the reference clock to the DDR/CPU clock. This process occurs beginning with step 410, where the process monitors the current output (reference clock) until a rising and subsequent falling edge are detected. Then, in step 412, the output is held low through the next rising and falling edges of the DDR/CPU clock. In step 408, the output is switched to the DDR/CPU clock while both the output and the DDR/CPU clock signals are low. Thus, upon the next rising edge of the DDR/CPU clock, the output clock signal will become a copy of the reference clock.

Once the satellite set-top device is running on the internal reference clock, it is possible to re-program the PLL that generates the CPU and DDR frequencies without affecting the system operation. The internal voltage-controlled oscillator (VCO) of the PLL is then reset and the PLL is restarted at the new frequencies. The reset affects only the PLL; the satellite set-top device is unaffected by the reset and continues operation without a reset. Once the new frequencies in the PLL are stable, the multiplexer is used as described above to seamlessly switch the CPU and DDR frequencies from the internal reference to the new CPU and DDR frequencies.

One advantage of the methods disclosed in various embodiments is that a device, such as a satellite set-top box, can continue operation without a reset when reprogramming the frequencies of both the CPU and DDR clocks. The reset is unnecessary because the method provides a glitchless clock multiplexer that seamlessly changes between PLL-generated clocks and an internal reference clock. The frequencies of the CPU and DDR are then reprogrammed and the multiplexer is used to seamlessly change these frequencies from the frequency of the internal reference clock to their new frequencies.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the patent claims and their equivalents.

What is claimed is:

1. A method comprising:
   detecting a level change of an output clock signal derived from a first clock signal;
   holding the output clock signal low first through a rising edge and then through a falling edge of a second clock signal; and
   substituting the second clock signal for the first clock signal as a source for the output clock signal after the falling edge of the second clock signal.

2. A circuit comprising:
   a first input for a first clock signal;
   a second input for a second clock signal;
   a clock signal output; and
   a control circuit connected to the first and second inputs and the clock signal output and configured to detect a level change of an output clock signal, operating to initially provide the output clock signal based on the first clock signal, and to substitute, in response to a control input, a second clock signal for the first clock signal after a falling edge of the second clock signal;
   wherein the output clock signal is held low first through a rising edge and then through the falling edge of the second clock signal.

3. A circuit comprising:
   a first input for a first clock signal;
   a second input for a second clock signal;
   a clock signal output; and
   a control circuit including a decoder connected to the first and second inputs and the clock signal output and configured to detect a level change of an output clock signal, operating to initially provide the output clock signal based on the first clock signal, and in response to a control input, to hold the output clock signal low first through a rising edge and then through a falling edge of the second clock signal, and to substitute the second clock signal for the first clock signal after the falling edge of the second clock signal.

4. A method comprising:
   in a clock signal circuit providing a clock signal at a clock signal output, substituting a reference clock signal for the clock signal at the clock signal output;
   resetting an internal voltage controlled oscillator of a phase locked loop (PLL) generator for the clock signal;
   controlling the PLL for the clock signal so as to modify a frequency of the clock signal and generate a frequency-modified clock signal;
   detecting a level change of the reference clock signal at the clock signal output;
   holding the reference clock signal at the clock signal output low first through a rising edge and then through a falling edge of the frequency-modified clock signal; and
   substituting the frequency-modified clock signal for the reference clock signal at the clock signal output after the falling edge of the frequency-modified clock signal.

5. The method of claim 4, further comprising the step of restarting the PLL to generate the frequency-modified clock signal.

6. The method of claim 5, further comprising the step of stabilizing the frequency-modified clock signal prior to substituting the frequency-modified clock signal for the reference clock signal at the clock signal output.

7. A method comprising:
   detecting a level change of an output clock signal derived from a first clock signal;
   holding the output clock signal low first through a rising edge and then through a falling edge of a second clock signal; and
   using a multiplexer to substitute the second clock signal for the first clock signal, after the falling edge of the second clock signal, as a source for the output clock signal.

8. The method of claim 7, wherein the first clock signal is generated by a phase locked loop.

9. The method of claim 7, wherein the second clock signal is generated by a crystal oscillator.

10. The circuit of claim 3, further comprising a phase locked loop (PLL) that generates the first clock signal.

11. The circuit of claim 3, further comprising a crystal oscillator that generates the second clock signal.

* * * * *

UNITED STATES PATENT AND TRADEMARK OFFICE
CERTIFICATE OF CORRECTION

| | | |
|---|---|---|
| PATENT NO. | : 7,609,095 B2 | Page 1 of 1 |
| APPLICATION NO. | : 11/122002 | |
| DATED | : October 27, 2009 | |
| INVENTOR(S) | : Grand et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 212 days.

Signed and Sealed this

Fourteenth Day of December, 2010

David J. Kappos
*Director of the United States Patent and Trademark Office*